United States Patent
Deng et al.

(10) Patent No.: US 7,518,874 B2
(45) Date of Patent: Apr. 14, 2009

(54) HEAT SINK ASSEMBLY

(75) Inventors: Jie-Cheng Deng, Shenzhen (CN); Jun Cao, Shenzhen (CN); Shi-Wen Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 62 days.

(21) Appl. No.: 11/837,458

(22) Filed: Aug. 10, 2007

(65) Prior Publication Data

US 2009/0040729 A1 Feb. 12, 2009

(51) Int. Cl.
*H05K 7/20* (2006.01)
*H01L 23/36* (2006.01)

(52) U.S. Cl. .................. 361/710; 361/703; 361/704; 361/705; 361/709; 165/80.3; 165/104.33; 257/718; 24/458; 174/16.3

(58) Field of Classification Search ............... 361/687, 361/702–712, 715–722, 727; 165/80.2, 80.3, 165/80.4, 80.5, 104.33, 121; 174/15.1, 16.3, 174/252; 257/706–727; 24/458, 453, 457; 411/516, 522, 523, 520; 248/505, 510
See application file for complete search history.

(56) References Cited

U.S. PATENT DOCUMENTS

| | | | | |
|---|---|---|---|---|
| 5,448,449 A | * | 9/1995 | Bright et al. ................. | 361/704 |
| 6,118,659 A | * | 9/2000 | Adams et al. ................. | 361/704 |
| 6,392,886 B1 | * | 5/2002 | Lee et al. ..................... | 361/703 |
| 6,496,371 B2 | * | 12/2002 | Winkel et al. ................ | 361/703 |
| 6,510,054 B1 | * | 1/2003 | Chen ............................ | 361/704 |
| 6,518,507 B1 | * | 2/2003 | Chen ............................ | 174/252 |
| 6,707,672 B2 | * | 3/2004 | Liu .............................. | 361/704 |
| 6,786,641 B2 | * | 9/2004 | Plourde ........................ | 383/64 |
| 6,947,283 B2 | * | 9/2005 | Hsieh et al. .................. | 361/703 |
| 7,123,482 B2 | * | 10/2006 | Barsun et al. ................ | 361/704 |
| 7,142,429 B2 | * | 11/2006 | Hsieh et al. .................. | 361/710 |
| 7,167,369 B1 | * | 1/2007 | Huynh et al. ................ | 361/719 |
| 7,180,746 B2 | * | 2/2007 | Yu et al. ...................... | 361/719 |
| 7,203,066 B2 | * | 4/2007 | Lee et al. ..................... | 361/704 |
| 7,233,496 B2 | * | 6/2007 | Lee et al. ..................... | 361/720 |
| 7,283,361 B2 | * | 10/2007 | Lee et al. ..................... | 361/704 |
| 7,385,826 B2 | * | 6/2008 | Barina et al. ................. | 361/719 |
| 2003/0103332 A1 | * | 6/2003 | Sopko et al. ................. | 361/704 |
| 2004/0066626 A1 | | 4/2004 | Lee et al. | |

* cited by examiner

*Primary Examiner*—Michael V Datskovskiy

(57) ABSTRACT

A heat sink assembly includes a heat sink and a clip assembly received in the heat sink. The clip assembly comprises a clip and a movable fastener pivotally connected to the clip via a pair of supporters. Each supporter defines a pivot hole deviated from a center thereof and a retaining slot above the pivot hole. The clip comprises a main body received in the heat sink and two arms extending from the main body and pivotally received in the retaining slots of the supporters. The movable fastener pivotally extends in the pivot holes of the supporters. The movable fastener moves relative to the heat sink and causes rotation of the supporters in a matter such that a distance from the main body of the clip to a bottom of the heat sink is changed, whereby the clip assembly can provide adjustable spring force acting on the heat sink.

12 Claims, 4 Drawing Sheets

HEAT SINK ASSEMBLY

BACKGROUND OF THE INVENTION

1. Field of the Invention

The present invention relates to a heat sink assembly, and more particularly to a heat sink assembly having a clip assembly which can provide adjustable spring force for positioning a heat sink on an electronic device.

2. Description of Related Art

A heat sink is usually placed in thermal contact with an electronic package such as a central processing unit (CPU), and transfers heat through conduction away from the electronic package so as to prevent over-heating of the electronic package. Usually, a heat sink is secured to an electronic package by using a clip.

Usually, a heat sink clip is for securing a heat sink to a CPU mounted on a CPU socket. Conventionally, the heat sink clip is made from a single piece of metal wire. The heat sink clip comprises a central pressing portion, a pair of resilient portions extending outwardly from opposite sides of the pressing portion respectively, and two arms extending from ends of the resilient portions respectively. A pair of hooks are inwardly formed from ends of the arms respectively. In use, the heat sink is placed on the CPU that is mounted on a printed circuit board. The heat sink clip extends through a channel defined by fins of the heat sink. The pressing portion of the clip rests on a base of the heat sink. The resilient arms are pressed downwardly so that the hooks of the arms are snappingly engaged with undersides of retaining ears of the printed circuit board. Thus the base of the heat sink is resiliently and firmly pressed against the CPU by the pressing portion of the heat sink clip. In this way, the heat sink is securely fastened to the CPU on the printed circuit board by the heat sink clip. US Patent Publication No. 2004/0066626 shows an example of a heat sink clip in a matter mentioned above. However, in operation, the heat sink clip usually fails to produce appropriate spring force acting on the base of the heat sink towards the CPU. The spring force from the heat sink clip is either too weak to firmly secure the heat sink to the CPU, or too strong to possibly damage the CPU. So, a heat sink clip which can provide an adjustable spring force acting on a heat sink towards an electronic device is needed.

SUMMARY OF THE INVENTION

A heat sink assembly in accordance with a preferred embodiment of the present invention comprises a heat sink and a clip assembly received in the heat sink for mounting the heat sink to a CPU with adjustable spring force. The clip assembly comprises a clip and a movable fastener both pivotally connected to a pair of supporters. Each supporter defines a pivot hole deviated from a center thereof and a retaining slot above the pivot hole. The clip comprises a main body received in the heat sink and a pair of arms extending from opposite ends of the main body and pivotally received in the retaining slots of the supporters. The movable fastener comprises a pair of engaging portions pivotally extending in the pivot holes of the supporters. The movable fastener moves relative to the heat sink to cause rotation of the supporters in a matter such that a distance from the main body of the clip to a bottom of the heat sink is changed. Thus, the clip assembly can provide adjustable spring force acting on the heat sink to firmly position the heat sink on the printed circuit board without the possibility of damaging the CPU.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
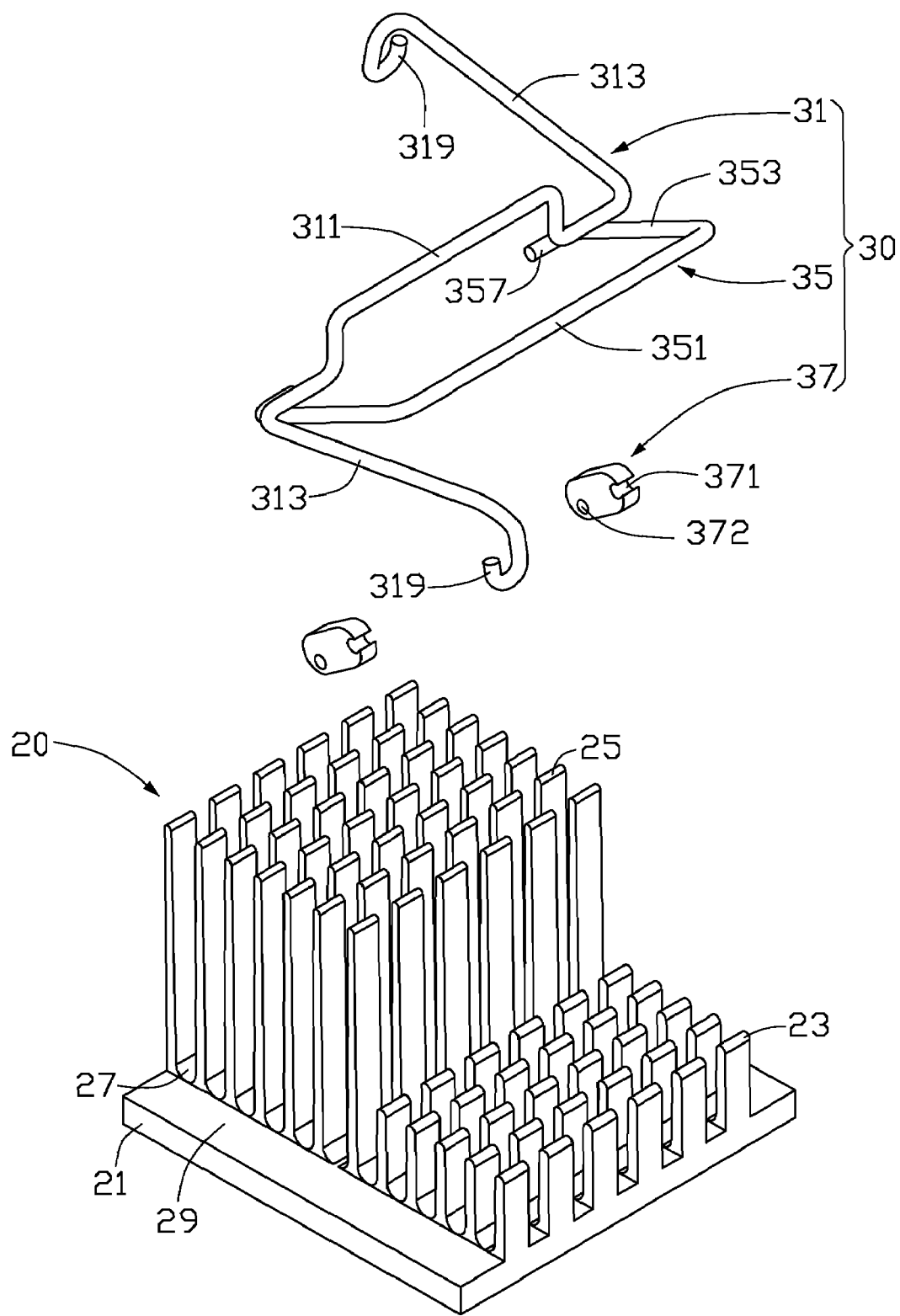
FIG. 1 is an exploded, isometric view of a heat sink assembly in accordance with a preferred embodiment of the present invention.
Figure 2:
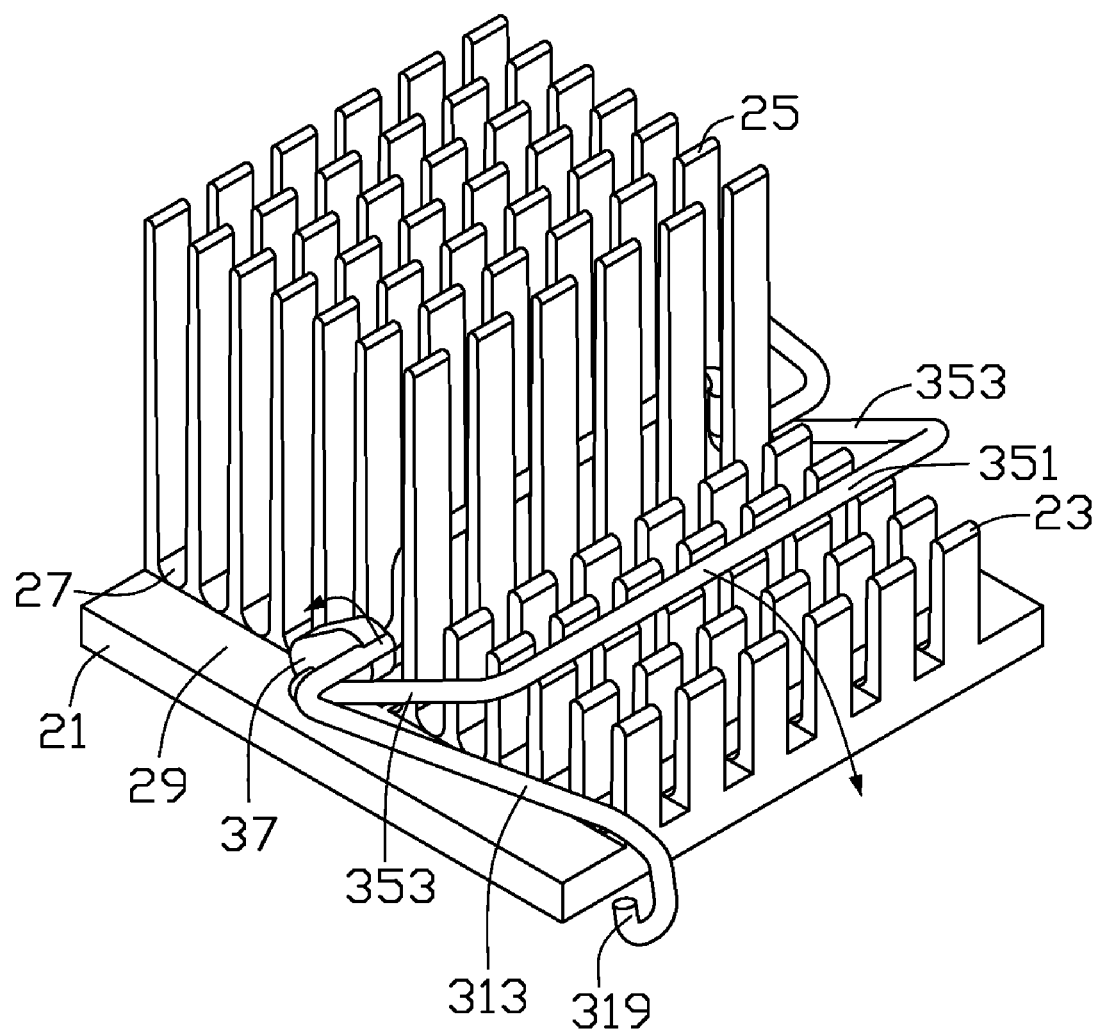
FIG. 2 is an assembled view of FIG. 1.
Figure 3:
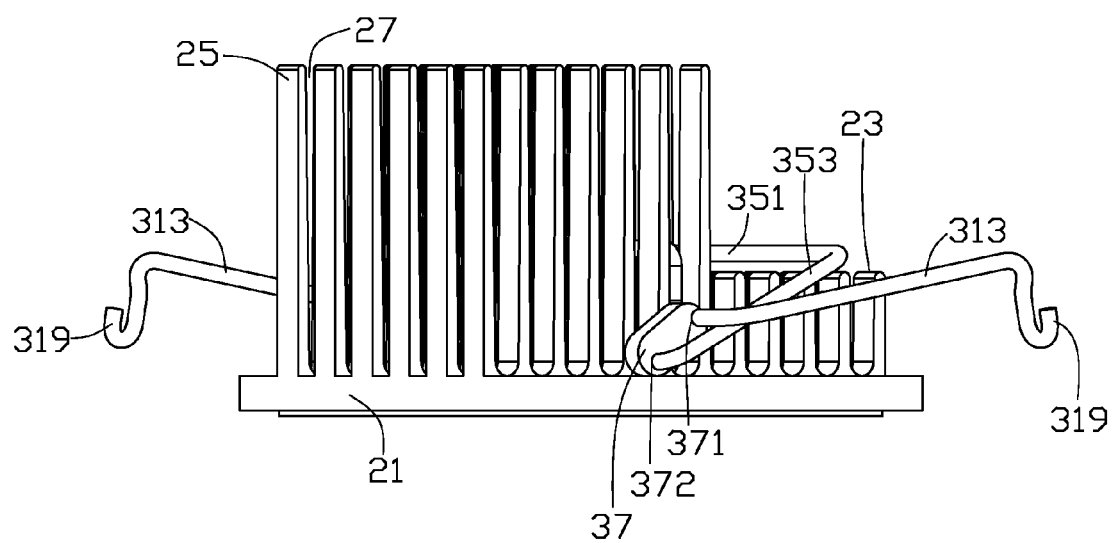
FIG. 3 is similar to FIG. 2, but viewed from another aspect.

FIGS. 1-3 illustrate a heat sink assembly in accordance with a preferred embodiment of the present invention. The heat sink assembly comprises a heat sink 20 and a clip assembly 30.

The heat sink 20 is made from a good heat conductive material, such as aluminum. The heat sink 20 comprises a base 21, first and second fin groups 23, 25 perpendicularly and upwardly extending from the base 21. The base 21 has a bottom face (not shown) for contacting the CPU and a pair of flanges 29 extending parallel from front and rear side edges thereof. A plurality of channels 27 is defined between fins (not labeled) of the first and second fin groups 23, 25. Each fin of the first fin group 23 has a height shorter than that of each fin of the second fin group 25.

The clip assembly 30 comprises a clip 31, a movable fastener 35 and a pair of supporters 37 rotatably connecting with the clip 31 and the movable fastener 35. Each of the clip 31 and movable fastener 35 is integrally made of a spring wire. The clip 31 comprises an elongated main body 311 for extending through the heat sink 20 in the channel 27 between the adjacent fins of the second fin group 25. A pair of arms 313 extend slantwise upwardly from opposite ends of the main body 311 in opposite directions. A pair of hooks 319 are formed at distal ends of the arms 313 and extend oppositely from each other. The movable fastener 35 comprises a linear operating portion 351, used as a handle, a pair of connecting portions 353 extending perpendicularly from opposite ends of the operating portion 351 and a pair of engaging portions 357 extending perpendicularly from ends of the connecting portions 353 and parallel to the operating portion 351. The engaging portions 357 extend toward each other. Each engaging portion 357 has a length shorter than that of each connecting portion 353. Each supporter 37 has a function like a cam and an elliptical-shaped configuration. A retaining slot 371 with around section is defined in a lateral side of each supporter 37 for pivotally receiving an end of a corresponding arm 313 of the clip 31 therein. A pivot hole 372 is defined in an end of each supporter 37 opposite the retaining slot 271, for pivotally receiving the engaging section 357 of the movable fastener 35 therein. The pivot hole 372 is located away from the retaining slot and deviated from a center of the supporter 37.

In assembly of the clip assembly 30, firstly, parts of the arms 313 adjacent to the main body 311 of the clip 31 are pivotally received in the retaining slots 371 of the supporters 37. The engaging portions 357 of the movable fastener 35 are forced to extend in the pivot holes 372 of the supporters 37 so that the movable fastener 35 is pivotally connected to the clip 31. The movable fastener 35 and the clip 31 are pivotally connected together by the supporters 37 in a matter such that the movable fastener 35 is capable of adjusting spring force exerted by the arms 313 of the clip 31 via rotation of the supporters 37.

In assembly, the clip assembly 30 is positioned across the heat sink 20, with the main body 311 of the clip 31 extending through the channel 27 of the fins of the second fin group 25. The arms 313 of the clip 31 and the supporters 37 are located at opposite ends of the channel 27. The movable fastener 35 is located inclinedly with an acute angle to the base 21 of the heat sink 20 and the operating portion 351 of the movable fastener 35 is oriented above the fins of the first fin group 23 of the heat sink 20. The connecting portions 353 of the movable fastener 35 are placed above the flanges 29 of the base 21 of the heat sink 20, and inclined in respect thereto.

Figure 4:
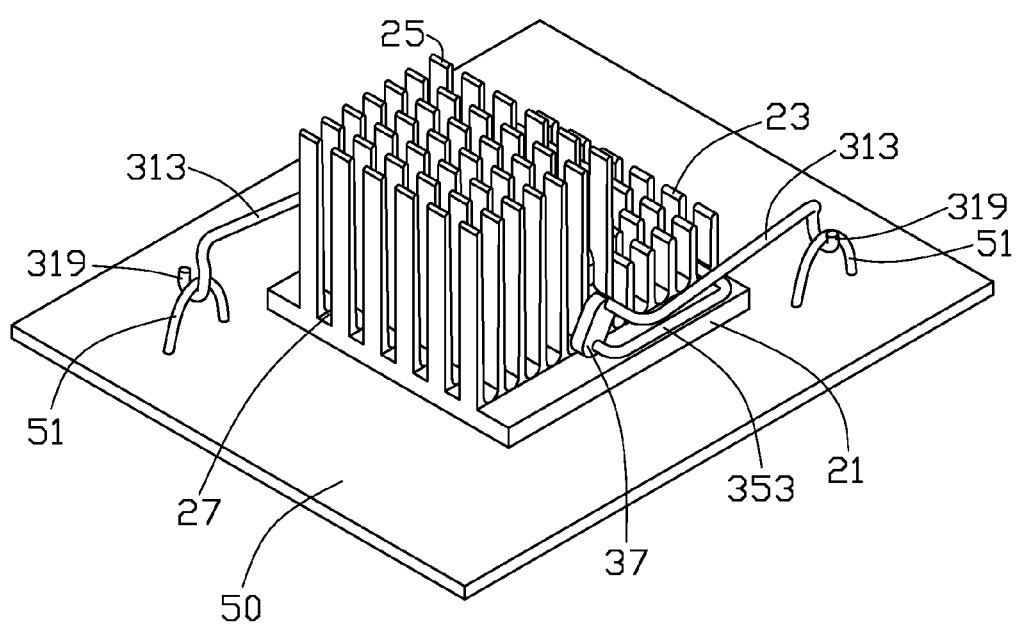
FIG. 4 is a perspective view of the heat sink assembly of FIG. 1 mounted on a printed circuit board.

Referring to FIG. 4, in operation, the heat sink assembly is mounted on a CPU (not shown). The CPU is mounted on a printed circuit board (PCB) 50. A pair of clasps 51 are provided on the printed circuit board 50 and located near two diagonally opposite corners of the heat sink 20. The clasps 51 are used for engaging with the clip assembly 30 of the heat sink assembly. The arms 313 of the clip 31 are pressed downwardly to cause the hooks 319 of the clip 31 be buckled with the clasps 51 of the printed circuit board 50. At this stage, the arms 313 of the clip 31 fails to produce strong spring force acting on the base 21 of the heat sink 20 towards the CPU to cause the bottom face of the base 21 to have an intimate contact with the CPU. The operating portion 351 of the movable fastener 35 is pulled along a direction away from the main body 311 of the clip 31 and then pushed downwardly until it is received in a corresponding channel 27 of the first fin group 23 and resiliently abuts against bottom ends of the fins of the first fin group 23. The connecting portions 353 of the movable fastener 35 are positioned on the flanges 29 of the heat sink 20. The pivot holes 372 of the supporters 37 are moved following the movement of the movable fastener 35 to cause the main body 311 of the clip 31 to move upwardly, so that the arms 313 of the clip 31 are forced to be stretched with the hooks 319 of the clip 31 being tightly buckled with the clasps 51. Thus, the arms 313 of the clip 31 produce downwardly enhanced spring force acting on the base 21 of the heat sink 20 towards the CPU. The base 21 of the heat sink 20 is pressed downwardly by the arms 313 of the clip via the supporters 37, whereby the bottom face of the base 21 can have an intimate contact with the CPU under enough spring force from the clip 31 of the clip assembly 30.

It is understood that in another application the movable fastener 35 can be moved backwards toward the main body 311 of the clip 31 to fit in another channel between the fins of the first fin group 23, thereby causing the supporters 37 to accordingly move backwards relative to the base 21 of the heat sink 20. By this, the distance from the main body 311 of the clip 31 to the base 21 of the heat sink 20 becomes shorter, and the spring force generated by the arms 313 of the clip 31 is lessened. The spring force of the arms 313 of the clip 31 is adjustable so that the clip 31 can provide appropriate spring force acting on the base 21 of the heat sink 20, whereby, depending on the size and weight of the heat sink 20 and the type of the CPU, the base 21 of the heat sink 20 can have an intimate contact with the CPU without the possibility of damaging the CPU by an excessive spring force.

In the present invention, the movable fastener 35 is pivotally connected to the supporters 37 and the distance from the main body 311 of the clip 31 to the base 21 of the heat sink 20 is adjusted by the rotation of the supporters 37 on the base 21 of the heat sink 20. The spring force generated by the arms 313 of the clip 31 is adjustable according to the changeable distances from the main body 311 of the clip 31 to the base 21 of the heat sink 20. By this provision of the clip assembly 30, the clip 31 is capable of offering advisable spring force acting on the base 21 of the heat sink 20, which can firmly position the heat sink 20 on the printed circuit board 50 in order to have an intimate contact with the CPU, without damaging the CPU by an excessive spring force or failing to firmly secure the heat sink 20 on the CPU.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly for dissipating heat generated by an electronic component, the heat sink assembly comprising:
    a heat sink having a base and a plurality of fins extending from the base, a plurality of channels being defined between the fins;
    a clip assembly for resiliently clamping the heat sink on the electronic component with adjustable spring force, the clip assembly comprising:
 a pair of supporters each having a pivot hole defined therein and deviated from a center thereof and a retaining slot located distant from the retaining hole;
 a clip pivotally connected to the supporters, the clip comprising a main body extending through the heat sink, a pair of arms extending from opposite ends of the main body and pressing the heat sink towards the electronic component, the arms being pivotally received in the slots of the supporters; and
 a movable fastener pivotally extending in the retaining holes of the supporters and received in a corresponding channel to engage with the fins of the heat sink;
 wherein the clip assembly is capable of providing appropriate spring force acting on the heat sink towards the electronic component when the movable fastener is moved relative to the base of the heat sink and a spring force generated by the arms of the clip is adjusted by rotation of the supporters on the base of the heat sink.

2. The heat sink assembly as claimed in claim 1, wherein the clip further comprises a pair of hooks extending from distal ends of the arms and clasping on a printed circuit board having the electronic component mounted thereon.

3. The heat sink assembly as claimed in claim 2, wherein each of the clip and the movable fastener is made of a spring wire.

4. The heat sink assembly as claimed in claim 3, wherein the movable fastener comprises an operating portion received in the corresponding channel of the heat sink, a pair of connecting portions extending from opposite ends of the operating portion and a pair of engaging portions formed at end portions of the connecting portions and pivotally extending in the pivot holes of the supporters.

5. The heat sink assembly as claimed in claim 4, wherein the arms of the clip are oriented in opposite directions and located above the base of the heat sink.

6. The heat sink assembly as claimed in claim 4, wherein the heat sink comprises a first fin group and a second fin group and the main body of the clip is received in a corresponding channel defined by the fins of the second fin group and the operating portion of the movable fastener is received in the corresponding channel defined by the fins of the first fin group.

7. The heat sink assembly as claimed in claim 6, wherein each fin of the first fin group has a length shorter than that of each fin of the second fin group.

8. The heat sink assembly as claimed in claim 6, wherein the base has two opposite flanges formed on opposite sides thereof and the supporters abut against the flanges of the base of the heat sink towards the electronic component.

9. A clip assembly for attaching a heat sink to an electronic component, comprising:

a pair of supporters each having a pivot hole defined therein and deviated from a center thereof and a retaining slot defined therein and spaced from the pivot hole;

a clip comprising a main body and a pair of arms extending from opposite ends of the main body, the arms being pivotally received in the retaining slots of the supporters; and a movable fastener comprising an operating portion, a pair of connecting portions extending from opposite ends of the operating portion and a pair of engaging portions formed at end portions of the connecting portions, the engaging portions being pivotally extended in the pivot holes of the supporters;

wherein when the movable fastener is moved relative to the clip, the arms of the clip produce changeable spring force by rotation of the supporters with the arms of the clip in respective to the pivot holes of the supporters, and the clip is capable of providing adjustable spring force via the rotation of the supporters.

10. The clip assembly as claimed in claim 9, wherein the arms of the clip are oriented in opposite directions.

11. The clip assembly as claimed in claim 10, wherein the clip further comprises a pair of hooks extending from distal ends of the arms of the clip.

12. The clip assembly as claimed in claim 10, wherein the engaging portions are oriented parallel to the operating portion of the movable fastener, and the connecting portions are oriented perpendicular to the operating portion of the movable fastener.

* * * * *